US012592702B2

(12) United States Patent
Candelier et al.

(10) Patent No.: US 12,592,702 B2
(45) Date of Patent: Mar. 31, 2026

(54) TEMPERATURE STABILIZED FREQUENCY CONTROL DEVICE

(71) Applicant: RAKON LIMITED, Auckland (NZ)

(72) Inventors: Vincent Candelier, Ermont (FR); Gweltas Beauto, Hennebont (FR); Andre Giordanengo, Mouans Sartoux (FR)

(73) Assignee: RAKON LIMITED, Auckland (NZ)

( * ) Notice: Subject to any disclaimer, the term of this patent is extended or adjusted under 35 U.S.C. 154(b) by 0 days.

(21) Appl. No.: 18/726,261

(22) PCT Filed: Dec. 21, 2022

(86) PCT No.: PCT/IB2022/062628
§ 371 (c)(1),
(2) Date: Jul. 2, 2024

(87) PCT Pub. No.: WO2023/131847
PCT Pub. Date: Jul. 13, 2023

(65) Prior Publication Data
US 2025/0080048 A1      Mar. 6, 2025

(30) Foreign Application Priority Data

Jan. 5, 2022    (NZ) ........................................ 784071

(51) Int. Cl.
*H03L 1/04*       (2006.01)
*H03B 5/04*       (2006.01)
*H03B 5/32*       (2006.01)
*H03L 1/02*       (2006.01)

(52) U.S. Cl.
CPC ................. *H03L 1/04* (2013.01); *H03B 5/04* (2013.01); *H03B 5/32* (2013.01); *H03L 1/028* (2013.01)

(58) Field of Classification Search
CPC .. H03L 1/04; H03L 1/028; H03L 1/02; H03B 5/04; H03B 5/36
See application file for complete search history.

(56) References Cited

U.S. PATENT DOCUMENTS

| | | | |
|---|---|---|---|
| 7,479,835 B2 * | 1/2009 | Mitome | ............... H05K 1/0212 |
| | | | 331/158 |
| 2005/0082377 A1 * | 4/2005 | Kato | .................... H05K 1/0201 |
| | | | 236/72 |
| 2009/0102567 A1 * | 4/2009 | Wacker | .................... H03L 1/04 |
| | | | 331/69 |
| 2012/0161887 A1 | 6/2012 | Ito et al. | |
| 2012/0229225 A1 | 9/2012 | Horie | |

(Continued)

FOREIGN PATENT DOCUMENTS

| | | |
|---|---|---|
| EP | 1598931 | 11/2005 |

OTHER PUBLICATIONS

Australian Patent Office, PCT/IB/2022/062628; International Search Report, Mar. 14, 2023; Oct. 11, 2023, 4 pages.

(Continued)

*Primary Examiner* — Ryan Johnson
(74) *Attorney, Agent, or Firm* — Niels Haun; Dann, Dorfman, Herrell & Skillman, P.C.

(57) ABSTRACT

The present invention offers useful ways of achieving high temperature stability of frequency determining components in temperature stabilized frequency control devices such as, for example, oven-controlled frequency reference devices.

19 Claims, 3 Drawing Sheets

(56) References Cited

U.S. PATENT DOCUMENTS

| | | | |
|---|---|---|---|
| 2013/0038400 A1* | 2/2013 | Asamura | H03L 1/025 |
| | | | 331/158 |
| 2013/0321088 A1 | 12/2013 | Vidoni et al. | |
| 2015/0282322 A1 | 10/2015 | Kondo | |
| 2017/0272081 A1 | 9/2017 | Chiang et al. | |
| 2017/0279452 A1 | 9/2017 | Hayashi | |
| 2018/0234052 A1 | 8/2018 | Noto | |

OTHER PUBLICATIONS

European Search report in corresponding EP Application No., 22918559.0 dated Nov. 18, 2025.

* cited by examiner

TEMPERATURE STABILIZED FREQUENCY CONTROL DEVICE

FIELD OF THE INVENTION

The present invention relates to electronic devices wherein temperature stabilization is utilized in order to achieve the required performance characteristics. Such devices include temperature stabilized frequency control products used in a variety of applications where accurate and stable frequency reference and/or timing signals are required.

BACKGROUND OF THE INVENTION

Temperature stabilization is often utilized in electronic devices as a way of achieving the required performance characteristics.

An Oven-Controlled Oscillator (OCO) is an example of a temperature stabilized frequency control device. OCOs are frequency control devices that generate output signals characterized by high frequency stability that is achieved, to a large extent, through internal temperature stabilization: i.e., while the ambient operating temperature for an OCO may vary over a wide range, such as, for example, from –40° C. to +85° C., the OCO's frequency determining components are kept at a stable temperature, which results in a stable output signal frequency, despite the ambient temperature variations.

In an oven-controlled crystal oscillator (OCXO), for example, frequency determining components that are sensitive to temperature variations comprise the crystal resonator and the active and passive components of the oscillator circuit. Maintaining a stable temperature of the frequency determining components is therefore a key factor in achieving a stable output frequency in OCXOs.

Historically, several different approaches to internal temperature stabilization in OCOs have been deployed, including,— placing frequency determining components in a heated enclosure (commonly called "an oven"), with one or more heating elements and a temperature control loop arranged to maintain the oven's temperature as stable as possible over the operating ambient temperature range;

arranging a second heated enclosure (a second "oven") wherein the first heated enclosure, containing frequency determining components, is placed—i.e., a double-oven arrangement.

In both of the aforementioned approaches, the oven's temperature is maintained at a temperature setpoint that is usually set higher than the higher limit of the device's operating ambient temperature range. The aforementioned approaches are associated with such downsides as relatively large device size and weight, high power consumption required to maintain the oven(s) at a stable temperature, and a relatively long warm-up time during a cold start.

Other approaches, aiming at reducing power consumption and enabling device miniaturization, have been known. One example of such an approach is a structure wherein a heating element is attached directly to the resonator's case in order to maintain a stable temperature of the main frequency determining component—the resonator. This approach, while capable of reducing the device's power consumption, compromises the temperature stabilization effectiveness and results in thermally induced stresses in the resonator. Another known approach, illustrated in FIG. 1, is to place the resonator 7 in close thermal contact with a heat distribution block 4 in order to spread the heat along the resonator's case and thus achieve a more even temperature distribution across the resonator 7 and reduce the thermally induced stresses in the resonator 7. This approach has the downsides of (a) insufficient temperature stability of other frequency determining electronic components 8 and (b) exposure of the other frequency determining electronic components 8 to convection airflow. FIG. 2 shows simulated thermal distribution inside the device of FIG. 1 at ambient temperature of –40° C.: the temperatures of frequency determining components 8 can differ by anywhere between 0.3° C. and 28° C. The resultant output frequency variation over the ambient temperature range of –40° C. to +85° C. is illustrated in FIGS. 3 and 3a. As shown in FIG. 3, when ambient temperature (graph t) varies in a cycle from +25° C. to +85° C. to –40° C. to +25° C., the device's output frequency (graph f) varies in the range from –6 ppb (parts per billion) to +8 ppb (total change magnitude of 14 ppb), with frequency hysteresis of 0.3 ppb as shown in FIG. 3a.

The present invention offers a solution enabling to produce temperature stabilized frequency control devices with substantially higher internal thermal stability and more uniform thermal distribution for the frequency determining components, which results in higher output frequency stability when ambient temperature varies.

SUMMARY OF THE INVENTION

The term "comprising" as used in this specification means "consisting at least in part of". When interpreting each statement in this specification that includes the term "comprising", features other than that or those prefaced by the term may also be present. Related terms such as "comprise" and "comprises" are to be interpreted in the same manner.

In temperature stabilized frequency control devices of the present invention, comprising frequency determining components including a resonator and frequency determining components other than the resonator, a heat distributor, and a substrate carrying at least some of the frequency determining components, the heat distributor is arranged to (a) define, in conjunction with the substrate, a space in which at least some of the frequency determining components are located, and (b) spread the heat throughout the resonator and throughout the said space.

Preferably, the heat distributor is made of a thermally conductive material such as, for example, copper.

In some embodiments, the space for placing at least some of the frequency determining components defined by the heat distributor and the substrate, can be a semi-enclosed space that is at least partially isolated from convection airflow outside of the said space.

In some embodiments, the space for placing at least some of the frequency determining components defined by the heat distributor and the substrate, can be a fully enclosed space that is completely isolated from convection airflow outside of the said space.

In some embodiments, the heat distributor can be thermally connected to a thermally conductive layer, such as a metallic plane, in the substrate.

In some embodiments, one or more heating elements, utilized to maintain a stable temperature inside the temperature stabilized frequency control device, are located outside of the space defined by the heat distributor and the substrate.

In some embodiments, one or more heating elements, utilized to maintain a stable temperature inside the temperature stabilized frequency control device, are located within the space defined by the heat distributor and the substrate.

In some embodiments, one or more heating elements, utilized to maintain a stable temperature inside the temperature stabilized frequency control device, are located on the surface of, and thermally linked to, the heat distributor.

In some embodiments, one or more heating elements, utilized to maintain a stable temperature inside the temperature stabilized frequency control device, are located on the surface of, and thermally linked to, the substrate carrying frequency determining components. Preferably, the position of the one or more heating elements is chosen to ensure a close thermal connection between the one or more heating elements, the heat distributor, and the substrate.

Without limiting the scope of the present invention, a person skilled in the art will be able to devise a suitable spatial arrangement for placing the constituent elements of a temperature stabilized frequency control device in order to take advantage of the possibilities offered by the present invention.

Various temperature stabilized frequency control devices could be constructed utilizing the present invention, including, but not limited to, Oven-Controlled Crystal Oscillator (OCXO) comprising an oscillator circuit with a crystal resonator, Oven-Controlled MEMS Oscillator (OCMO) comprising an oscillator circuit with a microelectromechanical systems (MEMS) resonator, Oven-Controlled SAW Oscillator (OCSO) comprising an oscillator circuit with a surface acoustic wave (SAW) resonator, and others.

BRIEF DESCRIPTION OF THE DRAWINGS

The invention is further described with reference to the accompanying figures in which,—

DETAILED DESCRIPTION OF THE INVENTION

Without limiting the scope of the present invention, the invention is illustrated herein by the following specific embodiment of an Oven-Controlled Crystal Oscillator (OCXO).

Figure 4:
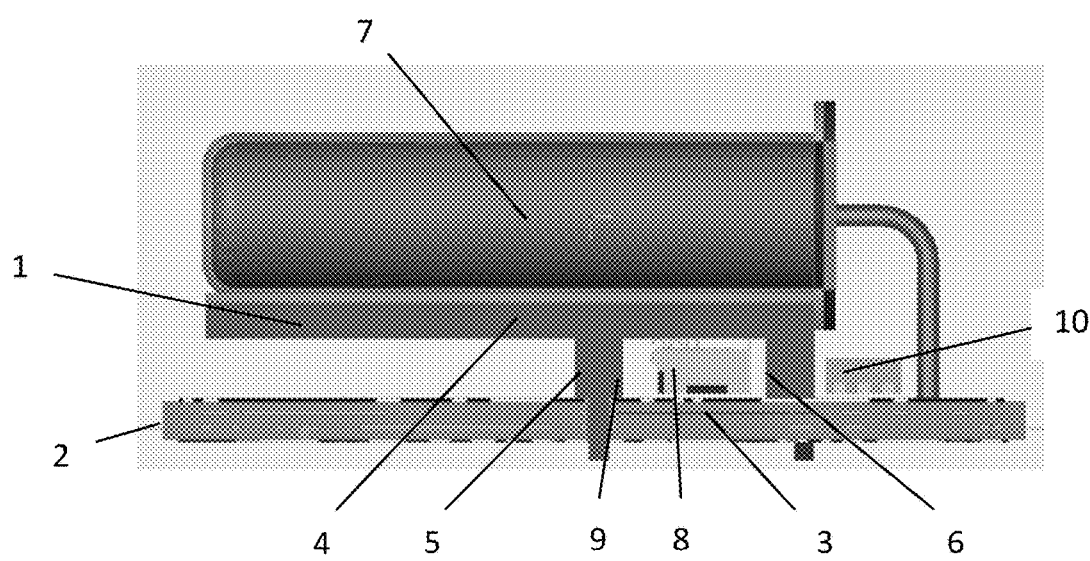
FIG. 4 shows an example of an OCXO implemented according to the present invention.

The constituent elements of the OCXO, including the heat distributor 1, can be arranged as shown in FIG. 4. The printed circuit board (PCB) substrate 2 carries all of the OCXO's electronic components. The PCB has an internal metal layer 3, which is, preferably, a ground plane; the ground plane serves both the electrical functions related to distributing ground level reference, and, importantly in the context of the present invention, improves thermal coupling between the OCXO components. The heat distributor 1 can be made of copper and is shaped to comprise a flat portion 4 and two portions 5 and 6 that are orthogonal to the flat portion 4. In this embodiment, the cross-section shape of the heat distributor 1 comprising the flat portion 4 and the two portions 5 and 6 shown in FIG. 4 resembles the English capital letter "F", and the heat distributor 1 will be referred to herein as the "F-shaped heat spreader" or "F-shaped heat radiator". A crystal resonator 7 is installed onto the flat portion 4 of the F-shaped heat spreader 1 and is closely thermally coupled to it. The other frequency determining components 8 are located in the semi-enclosed space 9 defined by the two portions 5 and 6 of the F-shaped heat radiator 1 and the PCB substrate 2. At least one heating element 10 is located on the substrate 2 in close vicinity, both spatially and thermally, to the F-shaped heat spreader 1. The F-shaped heat spreader 1 is installed onto the PCB 2 by through-hole soldering of at least one of the orthogonal portions 5 and 6. Preferably, the through-hole soldered portions 5 and 6 are electrically and thermally connected to the PCB internal metal layer 3.

In normal operation, when the OCXO's ambient temperature varies, power dissipated in the heating element 10 is controlled in such a way as to maintain a stable temperature of the F-shaped heat spreader 1 and of all components and elements thermally linked to the F-shaped heat spreader 1, including the resonator 7 and the other frequency determining components 8, which results in highly stable output signal frequency of the OCXO device.

Figures 5, 6, 6A:
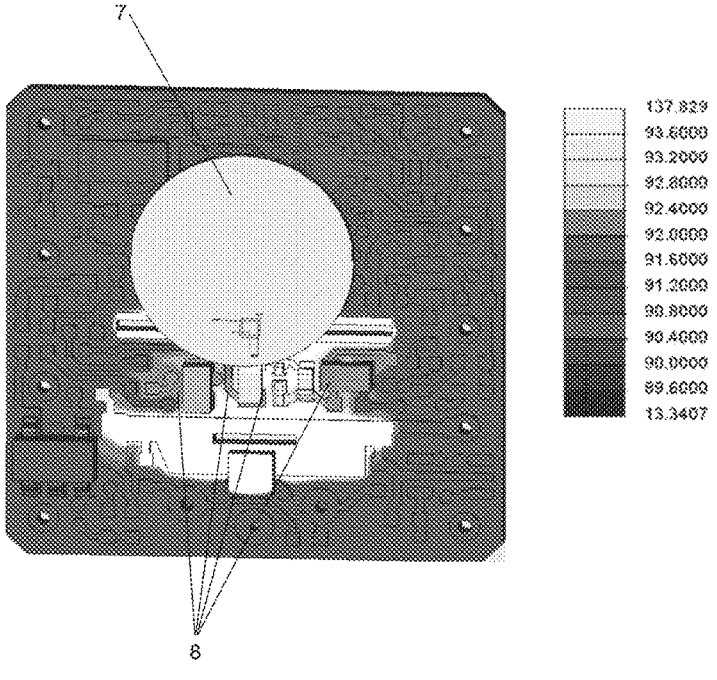
FIG. 5 shows simulated thermal distribution in a temperature stabilized frequency control device of the present invention.
FIGS. 6 and 6a show the output frequency variations exhibited by the OCXO device shown in FIG. 4.

There are several advantages of utilizing the F-shaped heat spreader 1 as shown in FIG. 4, including:

Closer thermal coupling between all of the main frequency determining components of the OCXO and, as a result, higher thermal stability of all of the main frequency determining components. As illustrated in FIG. 5 showing simulated thermal distribution inside a device utilizing an F-shaped heat distributor, at ambient temperature of −40° C. the temperatures of frequency determining components 8 differ by only 0.1° C. to 2.0° C.

Reduced thermally induced stress experienced by the resonator 7.

The frequency determining components 8 located in semi-enclosed space 9 are significantly less affected by convection airflow.

Unlike a traditional oven, the F-shaped heat spreader 1 is characterized by low mass and small size, which allows to achieve shorter warm up time for the device, and facilitates device miniaturization.

Figure 1:
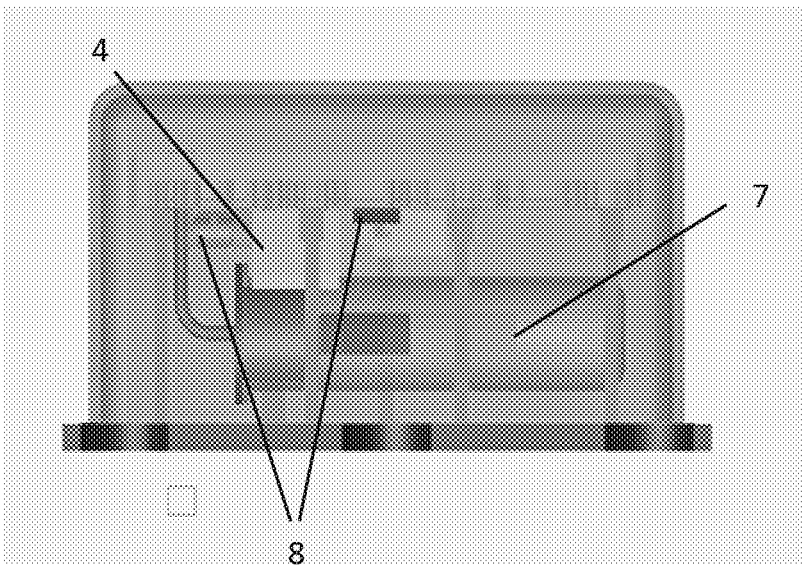
FIG. 1 shows an example of a prior art temperature stabilized oscillator device wherein a resonator is placed in close thermal contact with a heat distribution block.
Figure 2:
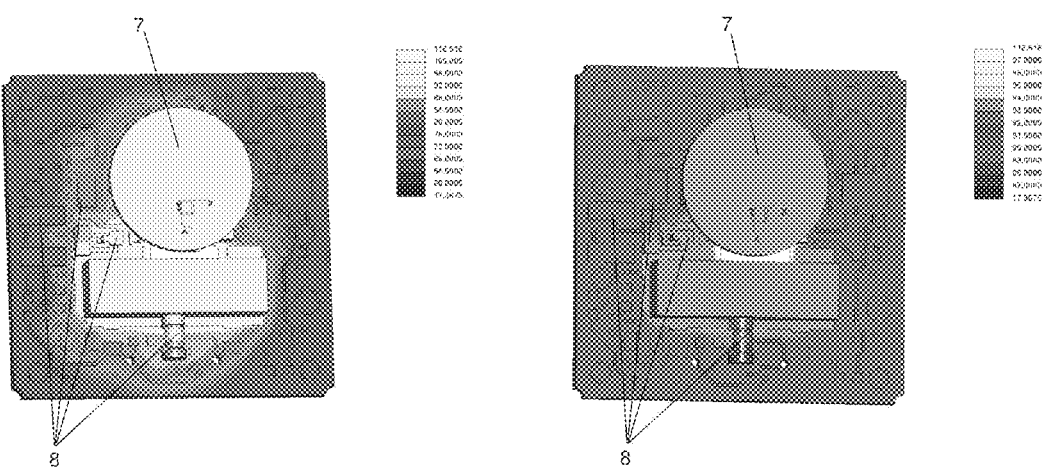
FIG. 2 shows simulated thermal distribution in a prior art temperature stabilized oscillator device shown in FIG. 1.
Figure 3:
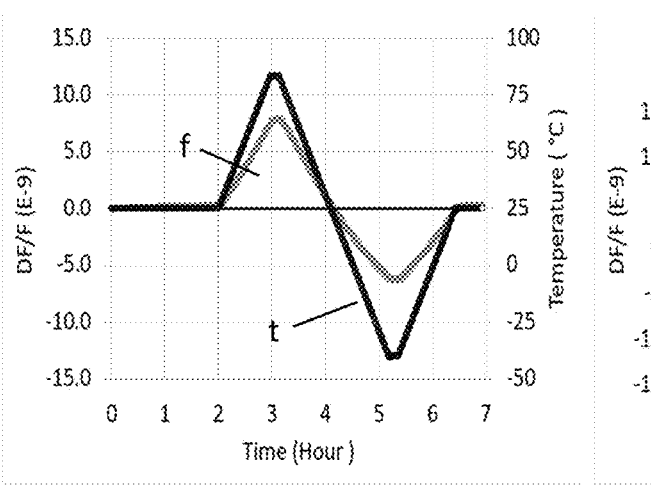
FIGS. 3 and 3a show the extent of output frequency variations exhibited by the prior art temperature stabilized device shown in FIG. 1.
Figure 3A:
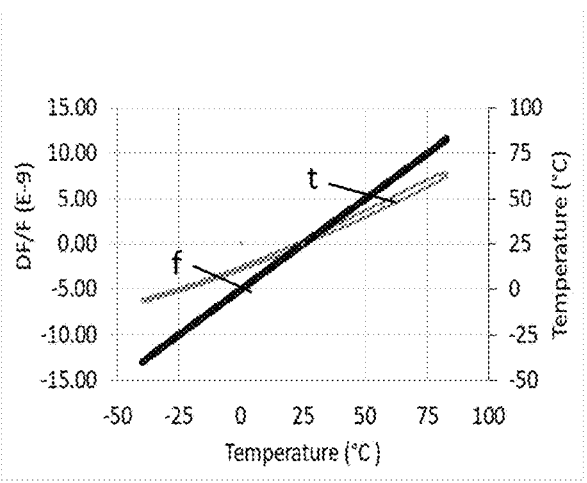

The higher thermal stability of all of the main frequency determining components results, in turn, in higher output frequency stability of the OCXO device, as illustrated in FIGS. 6 and 6a. As shown in FIG. 6, when the ambient temperature (graph t) varies in a cycle from +25° C., to +85° C., to −40° C., and back to +25° C., the device's output frequency (graph f) varies in the range from −1.25 ppb (parts per billion) to +0.75 ppb (total change magnitude of 2 ppb), with frequency hysteresis of 0.06 ppb as shown in FIG. 6a—this is a 7-fold improvement in output frequency stability and a 5-fold improvement in frequency hysteresis when compared to the performance of the prior art device shown in FIG. 1.

Temperature stabilized frequency control devices constructed according to the present invention can be used in a variety of electronic equipment and apparatus where accurate and stable frequency reference and/or timing signals are required, including, but not limited to, telecommunication infrastructure equipment, precise frequency and timing reference equipment, and test and measurement instrumentation.

The invention claimed is:

1. A temperature stabilized frequency control device comprising frequency determining components including a resonator and frequency determining components other than the resonator, a heat distributor, and a substrate having a thermally conductive layer therein and carrying at least some of the frequency determining components other than the resonator, wherein the heat distributor is arranged to define, in conjunction with the substrate, a space in which at least some of the frequency determining components other than the resonator are located, the heat distributor is thermally connected to the thermally conductive layer in the substrate, the heat distributor is arranged to spread heat throughout the resonator and throughout the said space, and wherein the resonator is installed onto the surface of, and in close thermal connection with, the heat distributor.

2. A temperature stabilized frequency control device according to claim 1, wherein the space in which at least some of the frequency determining components are located is a fully enclosed space.

3. A temperature stabilized frequency control device according to claim 1, wherein the space in which at least some of the frequency determining components are located is a semi-enclosed space.

4. A temperature stabilized frequency control device according to claim 1, wherein one or more heating elements are located outside of the space in which at least some of the frequency determining components are located.

5. A temperature stabilized frequency control device according to claim 1, wherein one or more heating elements are located within the space in which at least some of the frequency determining components are located.

6. A temperature stabilized frequency control device according to claim 1, wherein one or more heating elements are located on a surface of the heat distributor.

7. A temperature stabilized frequency control device according to claim 1, wherein one or more heating elements are located on a surface of the substrate.

8. An electronic apparatus comprising the temperature stabilized frequency control device according to claim 1.

9. A temperature stabilized frequency control device according to claim 1, wherein the thermally conductive layer is an internal metal layer of the substrate.

10. A temperature stabilized frequency control device according to claim 9, wherein the internal metal layer is a ground plane.

11. A temperature stabilized frequency control device according to claim 1, wherein the heat distributor is made of copper.

12. A temperature stabilized frequency control device according to claim 1, wherein the heat distributor comprises a flat portion and two portions orthogonal to the flat portion.

13. A temperature stabilized frequency control device according to claim 12, wherein the heat distributor is F-shaped.

14. A temperature stabilized frequency control device according to claim 12, wherein the resonator is installed onto the flat portion of the heat distributor.

15. A temperature stabilized frequency control device according to claim 12, wherein the space in which at least some of the frequency determining components other than the resonator are located is between the two portions orthogonal to the flat portion.

16. A temperature stabilized frequency control device according to claim 12, wherein the heat distributor is installed onto the substrate by at least one of the two portions orthogonal to the flat portion.

17. A temperature stabilized frequency control device according to claim 16, wherein the heat distributor is through-hole soldered to the substrate, wherein the at least one of the two portions orthogonal to the flat portion are electrically and thermally connected to the thermally conductive layer by the through-hole soldered connections.

18. A temperature stabilized frequency control device according to claim 1, wherein the substrate is a printed circuit board.

19. A temperature stabilized frequency control device comprising frequency determining components including a resonator and frequency determining components other than the resonator, a heat distributor, and a printed circuit board having an internal metal layer and carrying at least some of the frequency determining components other than the resonator, wherein the heat distributor is arranged to define, in conjunction with the printed circuit board, a space in which at least some of the frequency determining components other than the resonator are located, the heat distributor is thermally connected to the internal metal layer, the heat distributor is arranged to spread heat throughout the resonator and throughout the said space, and wherein the resonator is installed onto the surface of, and in close thermal connection with, the heat distributor.

* * * * *